(12) United States Patent
Fukuda

(10) Patent No.: US 7,595,701 B2
(45) Date of Patent: Sep. 29, 2009

(54) CRYSTAL OSCILLATOR

(75) Inventor: Minoru Fukuda, Sayama (JP)

(73) Assignee: Nihon Dempa Kogyo Co., Ltd. (JP)

( * ) Notice: Subject to any disclaimer, the term of this patent is extended or adjusted under 35 U.S.C. 154(b) by 166 days.

(21) Appl. No.: 11/717,456

(22) Filed: Mar. 13, 2007

(65) Prior Publication Data

US 2007/0229176 A1  Oct. 4, 2007

(30) Foreign Application Priority Data

Mar. 14, 2006  (JP) .............................. 2006-069331

(51) Int. Cl.
 *H03B 5/32*  (2006.01)
(52) U.S. Cl. .................... 331/158; 331/73; 331/66; 331/163; 331/154; 331/176
(58) Field of Classification Search .............. 331/58, 331/73, 139, 163, 154, 138, 158, 176, 66 R, 331/116 R, 116 FE, 23, 34, 36 C, 64, 66, 331/68, 69, 70, 175, 177 R, 185
See application file for complete search history.

(56) References Cited

U.S. PATENT DOCUMENTS

| | | | | |
|---|---|---|---|---|
| 5,064,296 A * | 11/1991 | Huijsing et al. | ............. | 374/163 |
| 5,705,957 A * | 1/1998 | Oka et al. | ..................... | 331/66 |
| 5,892,408 A * | 4/1999 | Binder | ........................ | 331/44 |
| 6,127,661 A * | 10/2000 | Fry | ............................. | 219/497 |
| 6,501,340 B1 * | 12/2002 | Flood | ......................... | 331/158 |
| 6,621,361 B1 * | 9/2003 | Fry | ............................. | 331/69 |
| 2003/0197567 A1 * | 10/2003 | Villella | ....................... | 331/158 |
| 2005/0093638 A1 * | 5/2005 | Lin et al. | .................... | 331/176 |
| 2005/0128018 A1 * | 6/2005 | Meltzer | ..................... | 331/176 |
| 2005/0184819 A1 | 8/2005 | Oita et al. | | |
| 2005/0258913 A1 | 11/2005 | Ito et al. | | |
| 2006/0192626 A1 * | 8/2006 | Milliren et al. | ............. | 331/158 |
| 2007/0040603 A1 * | 2/2007 | Shor et al. | .................. | 327/543 |

FOREIGN PATENT DOCUMENTS

| | | |
|---|---|---|
| JP | 10303645 | 11/1998 |
| JP | 3272633 | 1/2002 |
| JP | 2002135051 A | 5/2002 |
| JP | 2005159797 A | 6/2005 |
| JP | 2005236801 A2 | 9/2005 |
| JP | 2005333315 A2 | 12/2005 |

OTHER PUBLICATIONS

English Translation of paragraph [0008] of JP-2005159797 A, Jun. 16, 2005, Hideo, Outsuka.
English Translation of paragraphs [0009] and [0010] of JP-3272633, Jan. 25, 2002.

* cited by examiner

*Primary Examiner*—Arnold Kinkead
*Assistant Examiner*—Richard Tan
(74) *Attorney, Agent, or Firm*—Schwegman, Lundberg & Woessner, P.A.

(57) ABSTRACT

The present invention provides a constant temperature oven type crystal oscillator for reducing the difference of frequency stability caused by controlling the temperature in the oscillator when detecting the change of the outside-air temperature and controlling the amount of generated heat of a heat source provided in the oscillator.

5 Claims, 7 Drawing Sheets

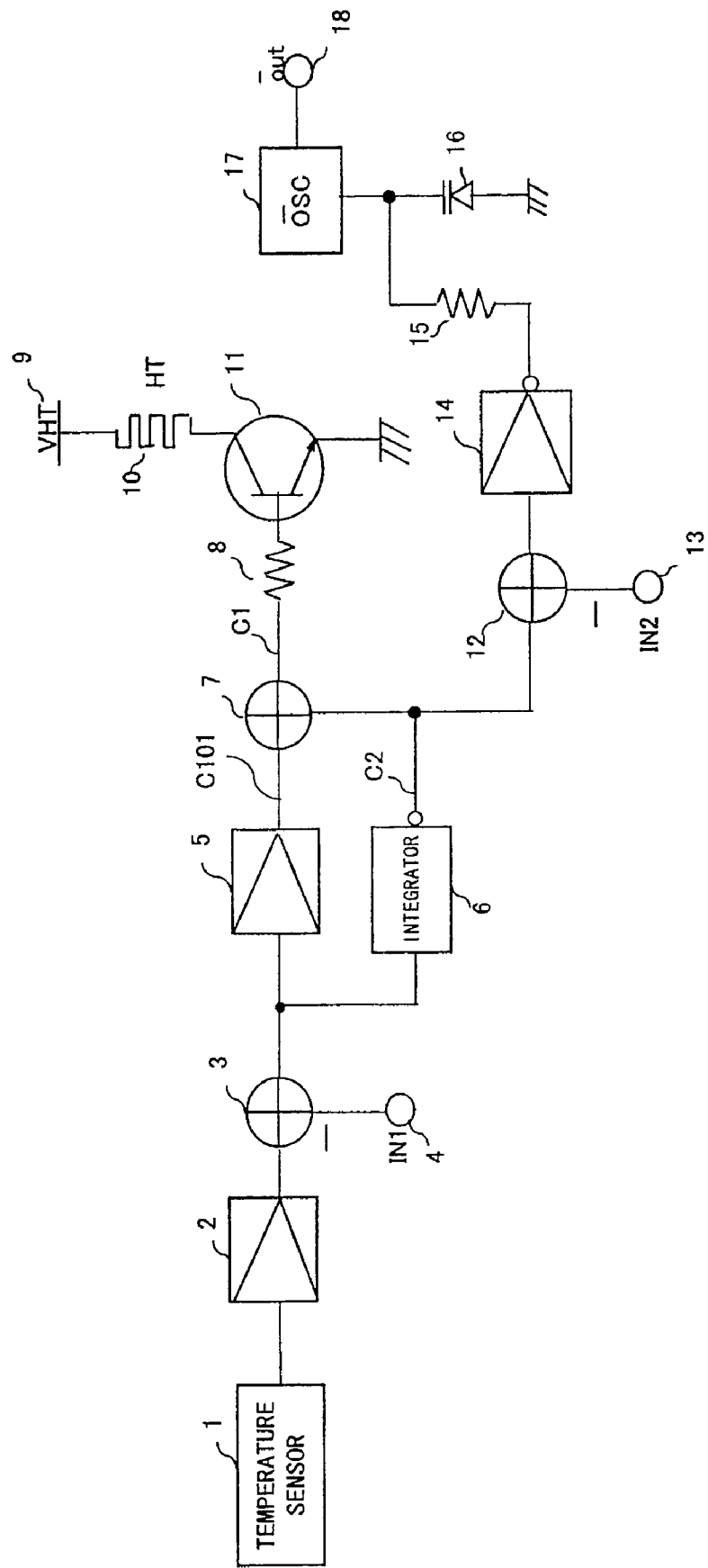
F I G. 4

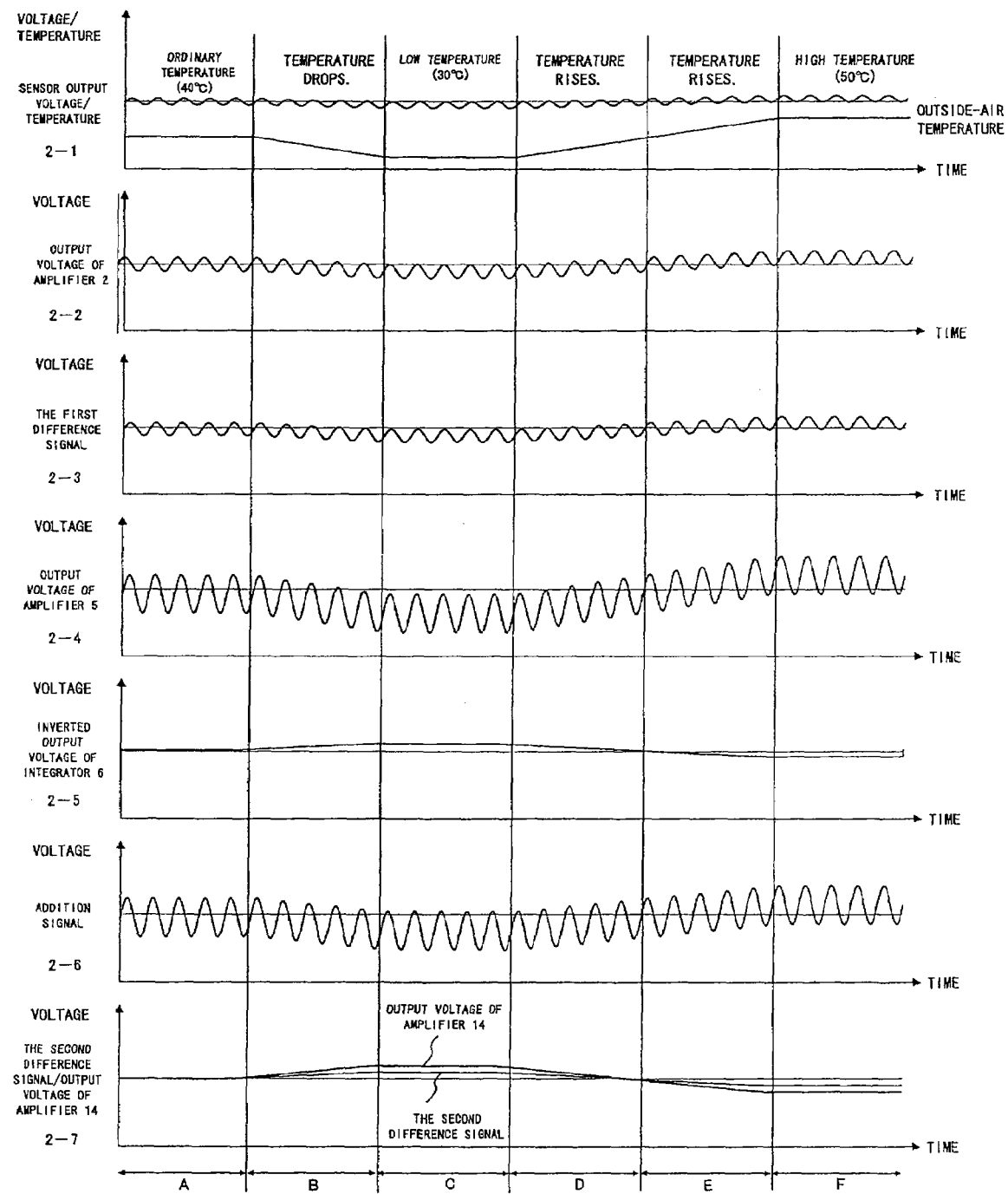
F I G. 5

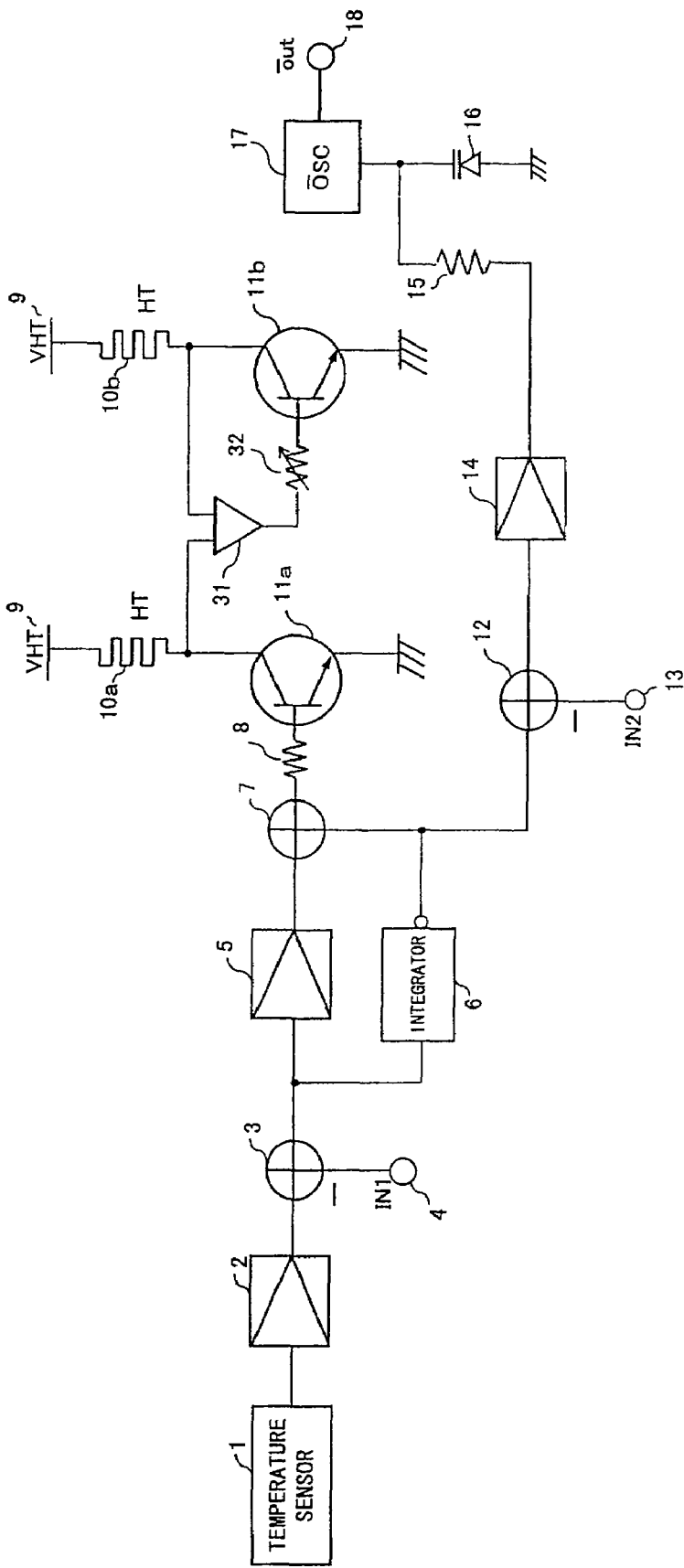
F I G. 7

CRYSTAL OSCILLATOR

RELATED APPLICATION

This application claims priority under 35 U.S.C. 119 to Japanese Application No. 2006-069331, filed Mar. 14, 2006, which application is incorporated herein by reference and made a part hereof.

BACKGROUND OF THE INVENTION

1. Fields of the Invention

The present invention relates to a technology for controlling the temperature of a crystal oscillator using a crystal oscillation device.

2. Description of the Related Art

Conventionally, there is a small crystal oscillator using a constant temperature oven in order to hardly be affected by the change of outside-air temperature. For its realization method, an oven-controlled crystal oscillator (OCXO) for accommodating a crystal oscillator device and its peripheral circuit in a constant temperature oven is known. By adopting the OCXO, an oscillation frequency which is easily changed by the change of outside-air temperature can be electrically corrected (temperature-compensated) to stably oscillate a crystal oscillator.

For example, in order to stabilize the frequency of a general OCXO using an SC-cut oscillation device, a frequency change is set within a temperature range of approximately the maximum temperature in use plus 10° C. (for example, the range C enclosed by a broken line on the temperature characteristic curve (SC-cut curve) shown in FIG. 1). Then, the temperature is compensated around a peak temperature in which the temperature in the set range is most stabilized.

Conventionally, a circuit composing a temperature sensor 101, an amplifier 102, an adder 103, a target temperature setting input terminal 104, an amplifier 105, an amplification adjustment resistor 106, a heater power terminal 107, a heater 108 and a transistor 109 as shown in FIG. 2A, compensates the temperature. Specifically, the amplifier 102 amplifies a voltage value corresponding to a temperature detected by the temperature sensor 101 up to a desired voltage. Then, the adder 103 adds the voltage value and a prescribed voltage inputted from the target temperature setting input terminal 104. Then, the amplifier 105 and the transistor 109 control current that flows through the heater 108 connected to the heater power terminal 107 on the basis of the result to adjust the temperature in the constant temperature oven.

However, in this configuration, when outside air temperature changes, the voltage takes the waveform shown in FIG. 2B (voltage waveform measured at C101). The waveform shown in FIG. 2B indicates a change by a value inputted from the target temperature setting input terminal 104. For example, around the outside-air temperature (ordinarily temperature), the voltage waveform becomes +80° C. and constant within the temperature range C shown in FIG. 1. In this case, the heater 108 controls the temperature of the entire circuit around the crystal oscillator device. If there is no change in the outside-air temperature, the voltage waveform is controlled around the input value from the target temperature setting input terminal 104. However, the outside-air temperature drops or rises, the voltage waveform C101 changes in asymmetry with the input value from the target temperature setting input terminal 104. This occurs due to the change of a thermal response characteristic. For example, if the outside-air temperature exceeds +40° C. when in temperature control, the outside-air temperature is +40° C. and the amount of thermal accumulation and radiation of the entire circuit are the same, the amount of thermal accumulation increases and that of thermal radiation decreases to make the entire circuit difficult to cool and make the temperature stable on the fairly high temperature side.

If conversely the outside-air temperature is less than +40° C., in the temperature control, the amount of thermal accumulation and that of thermal radiation increases to make the entire circuit difficult to warm and make the temperature stable on the fairly low temperature side. Therefore, according to the degree of difference from +40° C. of the outside-air temperature, the degree of the frequency stability changes. In order to prevent the frequency stability from depending on the outside-air temperature as described above, not only an oscillator using a thermally conductive plate in order to conduct the heat of a heat source and a crystal oscillation device, shown in FIG. 3A but also an oscillator with a constant temperature oven, so-called single-oven-structured oscillator, shown in FIG. 3B, are proposed.

In order to improve the stability against the change of the outside-air temperature, the correction value of each temperature measured by the thermistor or the like and is stored in memory, which is not shown in FIG. 3. Alternatively, the voltage of a variable-capacity diode for converting the value from digital to analog according to the outside-air temperature and controlling the crystal oscillation device in the oscillator can be controlled.

FIGS. 3A and 3B are described below. FIG. 3A shows the partial cross-section view of an oscillator using a thermally conductive plate and the flat view of its major part. FIG. 3B is the partial cross-section view of a single-oven-structured oscillator. The circuit substrate 601 of the oscillator shown in FIG. 3A is covered with a metal base 602 and a metal cover 603. The circuit substrate 601 comprises a crystal oscillation device 604 and its peripheral circuit. The peripheral circuit comprises an oscillation circuit, a temperature compensation circuit and a heating source. The oscillation circuit oscillates the crystal oscillation device 604. The thermal compensation circuit suppresses the influence on the circuit of a temperature change and controls the crystal oscillation device to stably oscillate. For the thermally conductive plate 608, a metal plate, such as an aluminum plate or the like is used. For example, as shown in FIG. 3A, a hollow is provided at each of one set of ends of one thermally conductive plate 608 and at each of the other set of ends orthogonal to this. An opening 605 is also provided in the center area. A through hole 607 through which the lead wire 606 of the crystal oscillation device 604 is provided in the outer circumference of the opening 605. Then, the four corners of the thermally conductive plate 608 are fixed on the circuit substrate 601 by screws, which are not shown in FIG. 3A. In this example, thermally conductive resin is spread between the circuit substrate 601 and the thermally conductive plate 608, which is not shown in FIG. 3A to thermally combine them.

In FIG. 3A, two heating sources (chip resistors 609a and 609b) are provided and is used a heating resistor by joule heat. They are disposed at one set of hollows of the thermally conductive plate 608 mounted on the circuit substrate 601. A transistor (power transistor) 610 used to heat is disposed at each of the other set of hollows of the thermally conductive plate 608. The chip resistors 609a and 609b and the transistor 610 are covered with thermally conductive resin. In this case, resin is also coated from the thermally conductive plate 608, and the chip resistors 609a and 609b, the transistor 610 and the thermally conductive plate 602 are thermally combined.

The respective thermally high-sensitive devices (variable-voltage capacitor device and thermistor) of the transistor 610 and a temperature detection device 611 are disposed at the opening 605 provided in the center area of the thermally conductive plate 608 and are thermally combined with the thermally conductive plate 608. The transistor 610 excluding the thermally high-sensitive devices is disposed at the other main surface of the circuit substrate 601, opposed to the thermally conductive plate 608, and the temperature detection device 611 is disposed in the outer circumference of both the surfaces of the circuit substrate 601.

FIG. 3B shows a single-oven-structure oscillator. The oscillator is provided for a substrate 612, and by covering the entire substrate with a metal base 613 and a metal cover 614 and by maintaining the inside temperature constant by controlling the temperature of a heater, such as a heating wire 615 or the like, the frequency is stabilized.

Patent reference 1 proposes a method for simplifying the component management by widely reducing the power consumption of the oscillator using a constant temperature oven and selecting the temperature detecting place of a thermally sensitive device for detecting the temperature inside/outside the constant temperature oven (inside/outside the constant temperature oven) depending on the specification of the thermally sensitive device.

According to patent reference 2, a piezo-electric vibrator, an amplification circuit and an oscillation circuit using a variable-capacity diode are disposed in a constant temperature oven in order to maintain the temperature of the piezo-electric vibrator constant. Then, a voltage generation circuit for outputting a control voltage in order to control the capacity value of a variable-capacity diode in such a way as to suppress the fluctuations of the oscillation frequency of the piezo-electric oscillator due to the change of the electrical characteristic of the amplification circuit accompanying a temperature change is further provided. The voltage generation circuit uses a thermistor with a plus or minus characteristic as a thermally sensitive device and compensates for a frequency change accompanying the change of the electrical characteristic of the amplification circuit due to the temperature change by controlling a control voltage. Thus, patent reference 2 proposes a method for easily realizing a small constant temperature oven type crystal oscillator which is superior in a frequency-temperature characteristic as described above.

Patent reference 3 proposes a method for obtaining a stable frequency, reducing the heat conduction from the outside, maintaining the temperature of the constant temperature oven stable and obtaining a stable frequency by reducing the loss of heat by reducing the number of the supporting point of a constant temperature oven to one and obtaining a more stable frequency by attaching a sensor to a support metal and anticipating a future temperature change from the temperature difference from the outside and controlling the temperature of the constant temperature oven.

However, in the case of a single-oven-structured oscillator, the proposals described in patent references 1-3 have a problem that the temperature in a constant temperature oven (of the entire circuit) is easy to change against the change of the outside-air temperature.

In order to shut the change of the outside-air temperature outside the oven for maintaining the temperature of the entire circuit around the crystal oscillation device and to maintain high stability even when the outside-air temperature changes, the single-oven structure shown in FIG. 3B or a double-oven structure can be adopted as another method. However, either of them has a disadvantage that power consumption increases.

Patent reference 1: Japanese Patent Application No. H10-303645
Patent reference 2: Japanese Patent Application No. 2002-135051
Patent reference 3: Japanese Patent Application No. 2005-159797

SUMMARY OF THE INVENTION

The present invention is made from the view point of the above-described situation, and it is an object of the present invention to provide a constant temperature oven type crystal oscillator which reduces the difference of the frequency stability, caused by detecting the change of the outside-air temperature and controlling temperature.

One aspect of the present invention is a constant temperature oven type crystal oscillator. The oscillator comprises a detection circuit for detecting a difference between a temperature signal outputted from a temperature detection device for sensing temperature inside the crystal oscillator and a predetermined target temperature input signal corresponding to a target temperature and generating a first difference signal, a temperature control circuit for generating an addition signal in which the influence on the temperature fluctuations of the first difference signal is suppressed, by adding the first difference signal and an extraction signal obtained by extracting the change of the first difference signal due to the temperature fluctuations and controlling the amount of generated heat of a heating source device for controlling the heat generation, provided in the oscillator, on the basis of the addition signal and a frequency compensation circuit for detecting the difference between a frequency compensation signal for compensating for the frequency of a crystal oscillator device and the extraction signal and making a second difference signal of it and stabilizing the vibration frequency of the crystal oscillator device on the basis of the second difference signal.

It is preferable for the frequency compensation circuit to use a signal for controlling the heating source device of the temperature control circuit as the additional signal.

It is also preferable for the frequency compensation circuit to relatively control temperature for each of the heating source devices when there is a plurality of the heating source devices.

It is also preferable for the frequency compensation circuit to compare the control signals for controlling the amount of heat generated for each of the heat source devices with each other and to adjust the control signal on the basis of the comparison result.

It is also preferable for a differential amplifier to compare them with each other.

It is also preferable for an integrator to calculate the extraction signal.

In the above-described configuration, if temperature is controlled when the outside-air temperature constant, as a result, both terminal voltages of the heat source device becomes constant. Both current of the heat source device also becomes constant.

If the outside-air temperature rises higher than a specific temperature, in order to stably maintain the temperature in the constant temperature oven, both terminal voltages of the heat source device are reduced and both current of it is reduced. Conversely, if the outside-air temperature drops below a specific temperature, in order to stably maintain the temperature, both terminal voltages of the heat source device are increased and both current of it is increased. The higher the outside-air temperature is, the grater the respective differences between the voltages and between the current of the heat source device at the ordinarily temperature is. Therefore, by detecting this voltage difference and correcting the frequency stability when the outside-air temperature fluctuates, the frequency stability can be improved.

According to the present invention, the frequency stability can be improved by detecting the fluctuations of the outside-air temperature, controlling temperature in the crystal oscillator and correcting an oscillation frequency.

BRIEF DESCRIPTION OF THE DRAWINGS

FIG. 4 shows the circuit configuration of the first preferred embodiment;
FIG. 5 shows the voltage waveforms of the first preferred embodiment;
FIG. 7 shows the circuit configuration of the third preferred embodiment.

DESCRIPTION OF THE PREFERRED EMBODIMENTS

The preferred embodiments of the present invention are described in detail below with reference to the drawings.

Figure 3A:
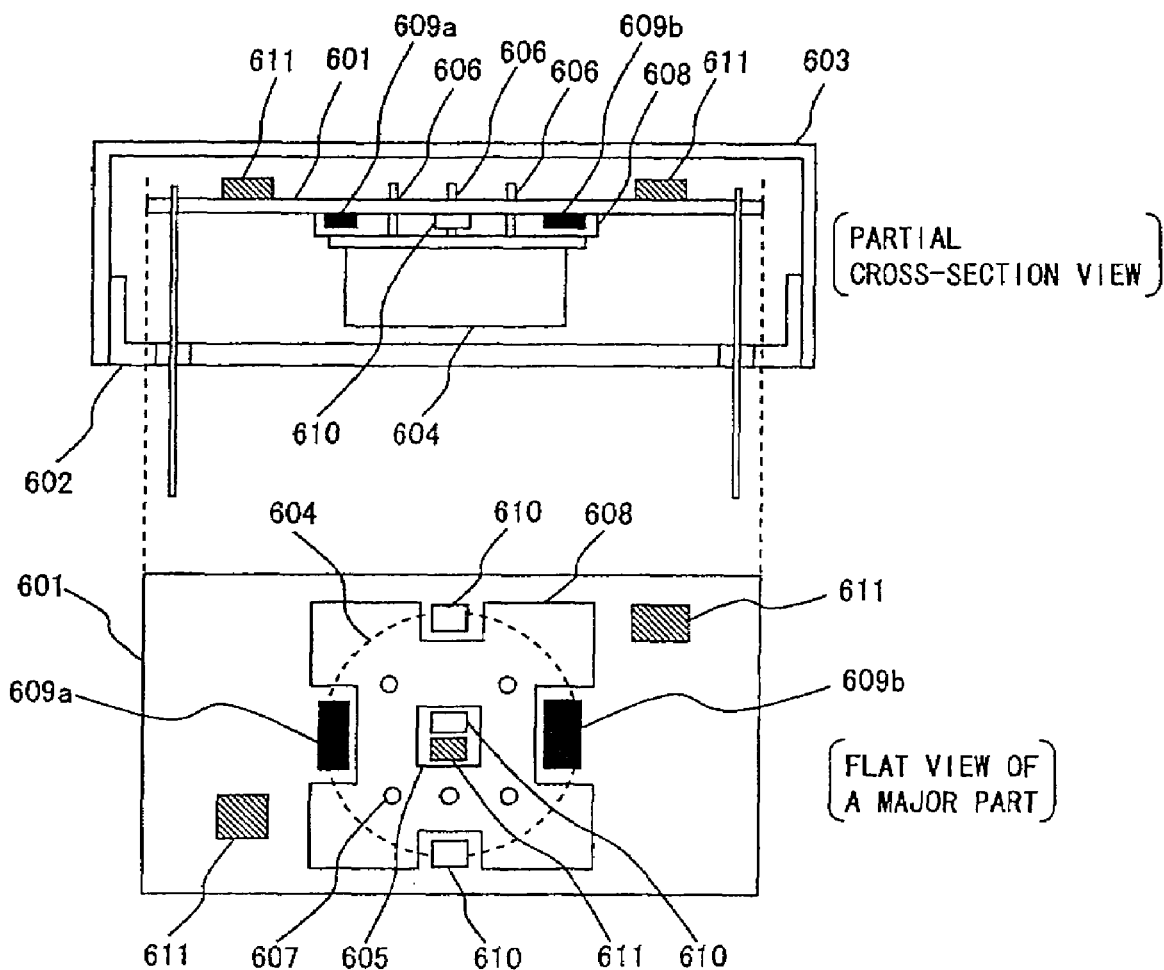
FIG. 3A shows the structure of an oscillator (partial cross-section view and the flat view of a major part)
Figure 3B:
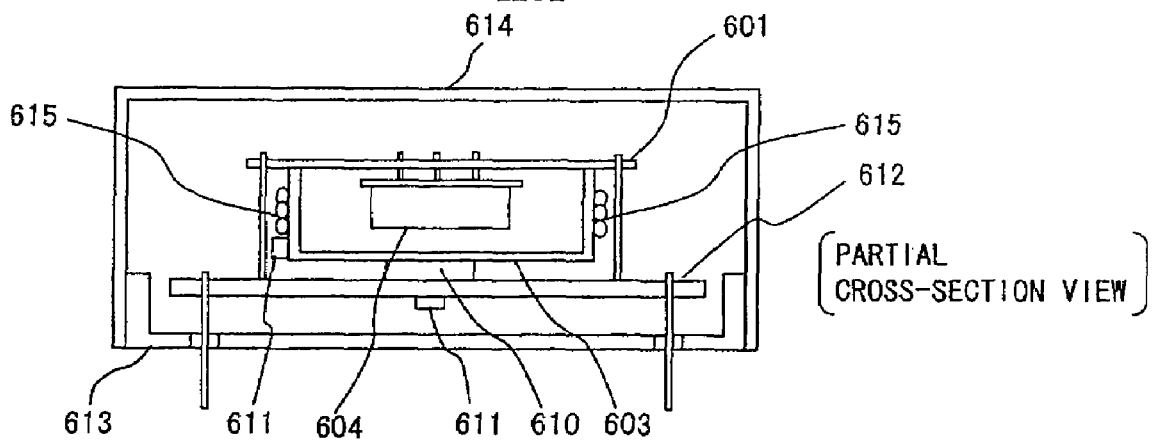
FIG. 3B shows another oscillator (partial cross-section view)

The First Preferred Embodiment (Circuit Configuration)
FIG. 4 is the block diagram of the temperature compensation circuit of the circuit substrate provided in a single-oven-structured oscillator (FIG. 3A). The temperature compensation circuit comprises a temperature sensor 1 (temperature detection device: a temperature sensing device, such as a thermistor or the like), an amplifier 2, an adder 3, a target temperature setting input terminal 4, an amplifier 5, an integrator 6, an adder 7, an amplification adjustment resistor 8, a heater power terminal 9, a heater 10 (heat source device: a heating chip resistor, a heating wire or the like), a transistor 11 (power transistor or the like), an adder 12, a frequency correction input terminal 13, an amplifier 14, a resistor 15, a variable capacity diode 16, a crystal oscillation device 17 and a frequency output terminal 18. The temperature sensor 1 and the heater 10 are mounted on a circuit substrate. It is preferable to dispose the temperature sensor 1 and the heater 10 near the crystal oscillation device 17. A plurality of them can also be mounted on the circuit substrate.

(Operation Description)
The voltage waveforms of the circuit shown in FIG. 4 are described with reference to FIG. 5.

The amplifier 2 amplifies the voltage value of a temperature signal outputted from the temperature sensor 1 (temperature detection device) for sensing temperature inside the crystal oscillator. In this preferred embodiment, as shown in the (2–1) of FIG. 5, the output voltage of the temperature sensor 1 varies depending on the change of the outside-air temperature. When temperature in a constant temperature oven is the ordinarily temperature, the output voltage is stable while vertically vibrating with a specific width (range A). When the temperature starts dropping, the voltage of the temperature sensor 1 starts dropping (ranges B and C). When the temperature rises, the voltage of the temperature sensor 1 starts rising (ranges D, E and F).

Then, as shown in the (2–2) of FIG. 5, the amplifier 2 amplifies the output voltage of the temperature sensor 1.

Figure 1:
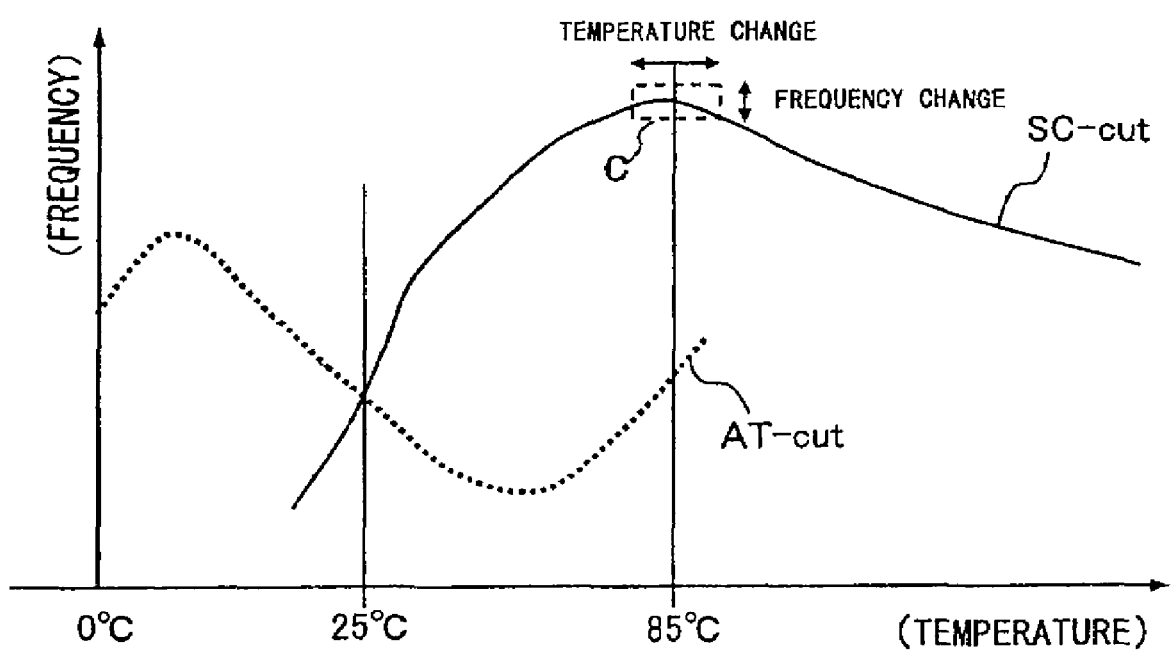
FIG. 1 shows the temperature setting range.
Figure 2A:
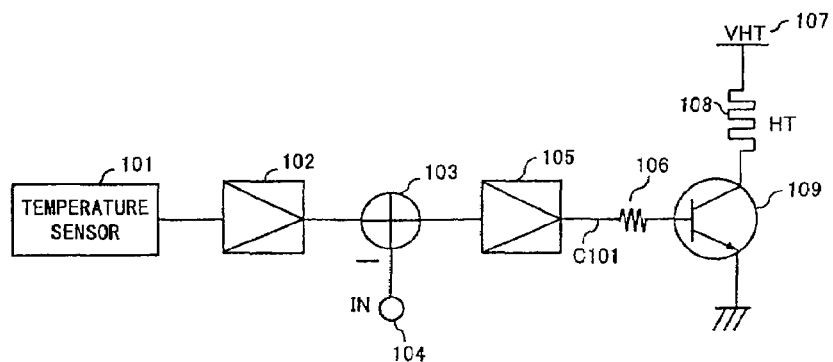
FIG. 2A shows the configuration of the conventional temperature compensation circuit.
Figure 2B:
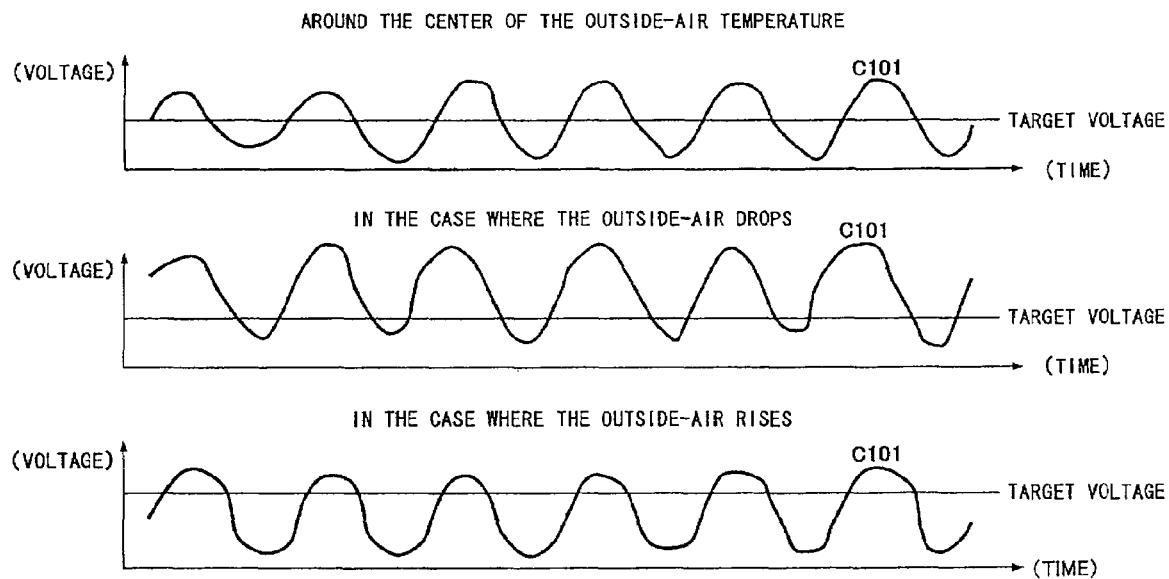
FIG. 2B shows the temperature characteristic of the conventional temperature compensation circuit.

A voltage value which is used as a reference when the heater 10 sets temperature inside the crystal oscillator to a target temperature (target temperature input signal) is inputted to the target temperature setting input terminal 4. When the target temperature is 85° C., which is almost the center of the range C (range within which both temperature and frequency are stabilized, enclosed by a broken line) shown in FIG. 1, a voltage corresponding to the temperature in the constant temperature oven sensed by the temperature sensor 1 is preset as the voltage. In this case, the target temperature input voltage is constant.

Then, the difference between the voltage output of the amplifier 2 and the target temperature input voltage is detected and is outputted as a difference signal (first difference signal)(detection circuit). In this preferred embodiment, the adder 3 detects it ((2–3) of FIG. 5).

Then, an addition signal in which the influence on the temperature fluctuations of the first difference signal is suppressed is generated by extracting the change of the first difference signal due to the temperature fluctuations and adding the extraction signal and the first difference signal and the amount of generated heat of the heater 10 is controlled on the basis of the addition signal (temperature control circuit). In this preferred embodiment, as shown in the (2–4) of FIG. 5, the amplifier 5 amplifies the first difference signal. In this case, the amplification factor is adjusted in such a way that the transistor 11, which is described later, can sufficiently control the heat generation of the heater 10.

The output of the integrator 6 changes the voltage conversely with the thermal response characteristic, as shown in low temperature (range C) and high temperature (range F). If the outside-air temperature exceeds +40° C. when in temperature control, the outside-air temperature is +40° C. and the amount of thermal accumulation and radiation of the entire circuit are the same, the amount of thermal accumulation increases and that of thermal radiation decreases to make the entire circuit difficult to cool and make the temperature stable on the fairly high temperature side (range F). If conversely the outside-air temperature is less than +40° C., in the temperature control, the amount of thermal accumulation and that of thermal radiation increases to make the entire circuit difficult to warm and make the temperature stable on the fairly low temperature side (range C). In this case, as shown in the (2–5) of FIG. 5, the extraction signal inverts a signal generated by the integrator 6 and outputs it.

Then, as shown in the (2–6) of FIG. 5, since when the outside-air temperature drops, the temperature in the oscillator drops, the output of the adder 7 to which the extraction signal and the first difference signal are inputted reduces the collector voltage of the transistor 11 and increases the current of the heater 10 so as to rise the temperature. Conversely, when the outside-air temperature rises, the collector voltage of the transistor 11 is increased and the current of the heater 10 is reduced so as to drop the temperature in the oscillator. In this case, in order to control the collector voltage as described above, attention is paid not so as for the output of the integrator 6 to kill the output of the amplifier 5. Specifically, the heater 10 is controlled as ever, and also the output of the integrator 6 adjusts the voltage by a voltage corresponding to the difference from +40° C. of the outside-air temperature, as in the ranges C and F. The heater current can be controlled by the relationship between the amplifiers 2 and 5.

Then, as shown in the (2–7) of FIG. 5, in order to correct the frequency of the crystal oscillation device 17, a correction voltage value (frequency correction signal) is preset and is inputted to the adder 12. Then, its difference with the extraction signal is detected is specified as a second difference signal. Then, the vibration frequency of the crystal oscillation device 17 is stabilized on the basis of the second difference signal (frequency compensation circuit). Specifically, although the temperature inside the oscillator is always changed by the fluctuations of the outside-air temperature and the frequency stability is also changed by the outside-air temperature, the output of the integrator 6 changes according to the amount of change of the outside-air temperature. By amplifying or attenuating this change by its difference with the input voltage of the frequency correction input terminal 13 as requested and changing the voltage of the variable-capacity diode 16, the oscillation of the crystal oscillation device 17 can be stabilized to improve the frequency stability of the frequency output terminal 18. Thus, according to the difference from +40° C. of the outside-air temperature, the frequency stability stops changing.

The Second Preferred Embodiment

Figure 6:
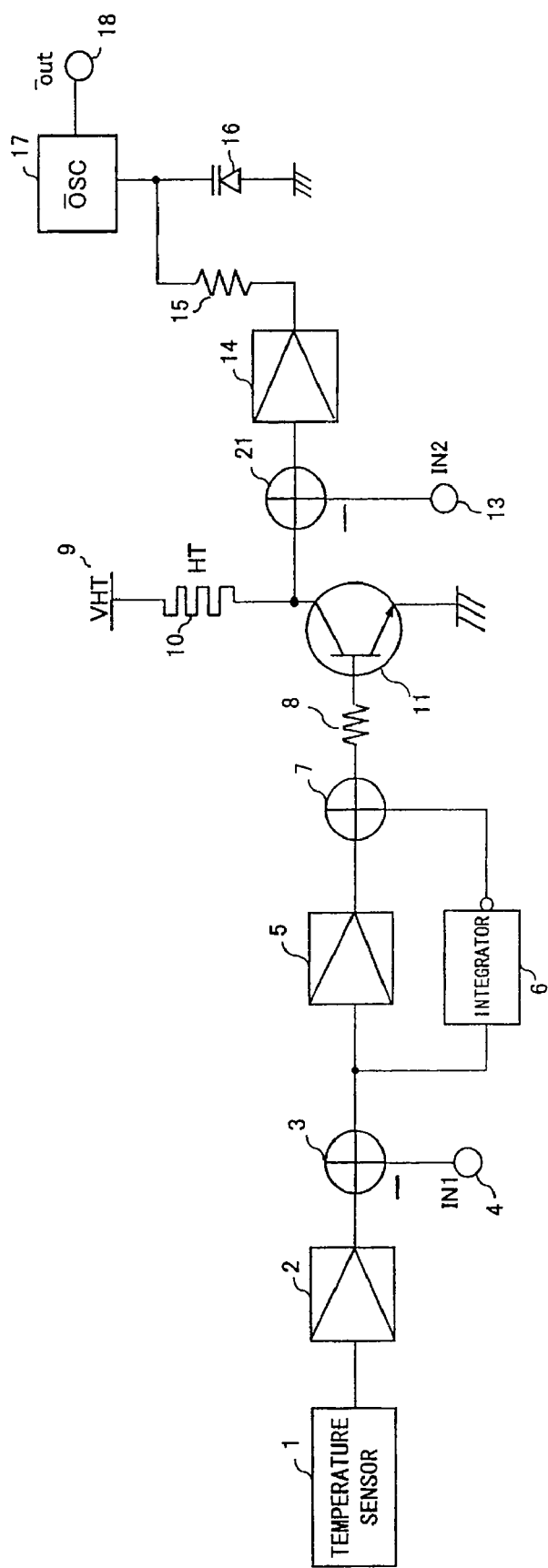
FIG. 6 shows the circuit configuration of the second preferred embodiment.

The second preferred embodiment can be obtained by transforming the circuit shown in FIG. 4. FIG. 6 adopts the detection of the outside-air temperature as a signal generated between the collector of the transistor 11 and the heater 10. A heater control signal is inputted to an adder 21 is amplified or attenuated by its difference with a voltage inputted from the frequency correction input terminal 13, as requested. Then, the voltage of the variable-capacity diode 16 is changed. Thus, the frequency stability of the frequency output terminal 18 can be improved. Thus, the oscillation frequency can be stably operated as in the first preferred embodiment.

The Third Preferred Embodiment

FIG. 7 shows the configuration of a circuit for controlling a plurality of heat source devices (a chip resistor and heating wires can also be used simultaneously). In the circuit shown in the first preferred embodiment, transistors 11a and 11b control heaters 10a and 10b, which are heat source devices, as shown in FIG. 7.

Thus, a comparator 31 compares the voltage value of the heater 10a with that of the heater 10b. Then, a variable resistor 32 adjusts current necessary for the heater 10b. The variable resistor 32 sets a signal necessary for the heater 10b to a value which is amplitude related to the signal of the heater 10a. The variable resistor can also be a fixed resistor. A differential amplifier or the like can also compare them.

In the above-described configuration, a plurality of heat source devices can be individually controlled and also the amount of generated heat can be controlled on the basis of the control of another heat source device.

By taking into consideration the positions of a plurality of heat source devices, the temperature compensation function can be further improved. Specifically, by disposing the heater at an appropriate place of the circuit substrate in such a way that the temperature in the constant temperature oven can become constant, the temperature in the constant temperature oven can be stabilized. If the heat source devices are disposed on the circuit substrate, a heater effect or the like due to the heat generation of a transistor or the like is taken into consideration in such a way that heating devices, such as a heat source device and the like may not collected at the same place.

The temperature of a part requiring the temperature characteristic of the peripheral circuit excluding the crystal oscillation device can be individually adjusted easily.

Even when a heating wire is used, the control signal can be also led into the circuit substrate 601 inside the single oven structure shown in FIG. 3A and the temperature can also be adjusted in conjunction with the heater. The detection circuit, the temperature control circuit and the frequency control circuit can also be mounted on the substrate 612. Alternatively, each of them can be mounted on a different substrate.

Although the above-described configuration is composed of analog circuits, the control system can be digitalized by converting the output signal of the temperature sensor 1 to digital (the digital signal process can be configured by hardware or by software using a CPU).

The present invention is not limited to the above-described preferred embodiments and can be improved and modified in various ways as long as the subject matter of the present invention is not deviated.

What is claimed is:

1. A constant temperature oven type crystal oscillator, comprising:
    a detection circuit for detecting a difference between a temperature signal outputted from a temperature detection device for sensing temperature inside the crystal oscillator and a predetermined target temperature input signal corresponding to a target temperature and generating a first difference signal;
    a temperature control circuit for generating an addition signal in which the influence on the temperature fluctuations of the first difference signal is suppressed, by adding the first difference signal and an extraction signal obtained by integrating and inverting the first difference signal due to temperature fluctuations so as to extract a change of the first difference signal and controlling an amount of generated heat of a heating source device for controlling heat generation, provided in the oscillator, on the basis of the addition signal; and
    a frequency compensation circuit for detecting a difference between a frequency compensation signal for compensating for a frequency of a crystal oscillator device and the extraction signal and making a second difference signal of it and stabilizing a vibration frequency of the crystal oscillator device on the basis of the second difference signal.

2. The crystal oscillator according to claim 1, wherein the frequency compensation circuit uses a signal for controlling the heat source device of the temperature control circuit as an addition signal.

3. The crystal oscillator according to claim 1, wherein when there is a plurality of the heat source devices, the temperature control circuit controls the temperature of each of the heat source devices relatively.

4. The crystal oscillator according to claim 3, wherein the temperature control circuit compares control signals for controlling the amount of generated heat of each of the heat source devices with each other and adjusts the control signal on the basis of the comparison result.

5. The crystal oscillator according to claim 4, wherein the comparison is performed by a differential amplifier.

* * * * *